United States Patent [19]

Flanders et al.

[11] 4,170,512

[45] Oct. 9, 1979

[54] METHOD OF MANUFACTURE OF A SOFT-X-RAY MASK

[75] Inventors: Dale C. Flanders, Waltham; Henry I. Smith, Sudbury; Muriel A. Dalomba, Dorchester, all of Mass.

[73] Assignee: Massachusetts Institute of Technology, Cambridge, Mass.

[21] Appl. No.: 800,759

[22] Filed: May 26, 1977

[51] Int. Cl.² .............................................. G21F 5/04
[52] U.S. Cl. ...................... 156/631; 156/236; 156/246; 156/278; 156/632; 156/633; 156/634; 156/643; 156/656; 156/657; 156/663; 204/192 E; 250/492 R; 250/492 R; 250/505; 427/250; 427/385 A
[58] Field of Search ............... 156/628, 631, 632, 633, 156/246, 656, 657, 663, 630, 236, 278, 280, 643, 629, 634; 427/261, 385 A, 250; 264/255, 259, 299; 250/492 A, 492 R, 505; 260/78 TF; 204/192 E

[56] References Cited

U.S. PATENT DOCUMENTS

| | | | |
|---|---|---|---|
| 3,179,634 | 4/1965 | Edwards | 260/78 TF |
| 3,607,997 | 9/1971 | Linturn | 264/255 |
| 3,742,230 | 6/1973 | Spears et al. | 250/505 |
| 3,767,494 | 10/1973 | Muroqka et al. | 156/657 |
| 3,873,824 | 3/1975 | Bean et al. | 250/505 |
| 3,892,973 | 7/1975 | Coquin et al. | 250/492 A |
| 3,930,914 | 1/1976 | Hetrich | 156/626 |
| 4,037,111 | 7/1977 | Coquin et al. | 250/505 |

*Primary Examiner*—Jerome W. Massie
*Attorney, Agent, or Firm*—Arthur A. Smith, Jr.; Martin M. Santa

[57] ABSTRACT

A process for fabricating polyimide membrane x-ray lithography masks is described. Thin membrane of polyimide is formed by spinning polyamic acid on a glass substrate and polymerizing in situ. The glass substrate acts as a holder and efficient heat sink during formation of gold absorber patterns on top of the polyimide. A support ring is then bonded to the polyimide, and the glass etched in dilute HF. Optically smooth polyimide membranes with thicknesses from 0.5 to 5 μm are readily achieved. The method and resulting product is not limited to the above materials or to masks.

17 Claims, 8 Drawing Figures

METHOD OF MANUFACTURE OF A SOFT-X-RAY MASK

The Government has rights in this invention pursuant to Contract #F19628-76-3-0002 awarded by the U.S. Air Force and the Defense Advanced Research Projects Agency.

BACKGROUND OF THE INVENTION

This invention relates generally to the fabrication of metal patterns on thin polyimide membranes and more particularly to the production of masks for x-ray lithography.

Soft x-ray lithography (see Soft X-Ray Lithographic Apparatus and Process, Smith et al, U.S. Pat. No. 3,743,842, July 3, 1973) has been shown to be an effective and convenient means of replicating high resolution patterns. This capability has been demonstrated by the replication in an x-ray sensitive resist of a repetitive grating with linewidths less than 160 nanometers. In general, the masks used in x-ray lithography consist of a thin transmitter membrane which acts as a mechanical support for the absorber pattern. High attenuation in the mask membrane leads not only to long exposure time, but also to a reduction in the effective contrast of the mask. This is because the softer x-rays which are desirable for lithography are attenuated more than the harder x-rays. It is therefore desirable to minimize the attenuation of the soft x-rays in the mask transmitter membrane by utilizing a material with low absorptivity and by making the thickness of the transmitter membrane as small as possible.

Several materials have been used to fabricate x-ray transmitter membranes. These include silicon (See "Soft X-Ray Mask Support Substrate", David L. Spears et al, U.S. Pat. No. 3,742,230, June 26, 1973), $Al_2O_3$ (See P. A. Sullivan and J. H. McCoy, IEEE Trans. Electron. Devices, ED-22, 412, (1976)), $Si_3N_4$ (See E. Spiller et al, Solid State Technol., 19 62, (1976)) and Mylar ® and polyimide (J. S. Greeneich, IEEE Trans. Electron Devices, ED-22 434, (1975)). Silicon membranes thinner than 3 micrometers have not been fabricated. Silicon membranes are also opaque to visible radiation, a fact which makes the use of optical alignment techniques difficult. $AlO_3$ membranes as thin as 0.2 micrometers have been produced. However, they are quite fragile and are limited to small areas. $Si_3N_4$ and $Si_3N_4$-$SiO_2$ membranes of 0.1 and 0.2 micrometer thickness, respectively, have been fabricated, but they also are very fragile and have been limited to areas smaller than 3 mm by 3 mm. Mylar ® membranes have been used extensively for x-ray masks. The minimum thickness of Mylar ® films used for x-ray masks has been limited to the commercially available thickness of 3 micrometers. A major difficulty encountered in the use of Mylar ® mask transmitter membranes has been the extreme roughness of the surface of commercially available Mylar ®. In addition, it is necessary to provide a means of cooling the thin, heat sensitive polymer film when depositing metal on it or during ion beam etching of the x-ray absorber pattern. Commercially available polyimide films as thin as 6 micrometers have been used as x-ray transmitter membranes. The surface of commercial polyimide is considerably smoother than the surface of commercial Mylar ®. However, the difficult problem of heat-sinking the membrane during metal deposition and etching of the absorber pattern remains.

It is therefore the object of this invention to provide a novel and useful mask and a process for fabricating an x-ray mask whose transmitter membrane has low x-ray attenuation, has a smooth surface, and is optically transparent. It is a feature of this invention that the thin mask membrane remains attached to a glass substrate during fabrication of the absorber pattern thus eliminating any problems of heating during absorber pattern formation.

SUMMARY OF THE INVENTION

X-ray masks with optically smooth polyimide transmitter membranes 0.05–50 micrometers thick which are supported on a rigid holder can be fabricated by the following procedure.

A glass substrate is coated with a film of polyamic acid (typically Dupont product PI-2530, U.S. Pat. No. 3,179,634). The film is polymerized by heating, to yield polyimide. The desired absorber pattern is fabricated on the polyimide surface by any of the thin film lithographic techniques known to those skilled in the art. A metal tube is sealed to the polyimide surface using an adhesive, typically, an epoxy, and the glass substrate is dissolved by etching in hydrofluoric acid. The mask membrane can be transferred to a rigid holder smaller than the metal tube by glueing the holder to the top or bottom surface of the membrane and cutting away the excess membrane outside the ring. Distortion of the membrane during mounting of the holder can be avoided by glueing the holder to the polyimide prior to the etching of the substrate.

An attractive feature of this process is the fact that the membrane remains attached to the glass substrate during fabrication of the absorber pattern. The problem of heat-sinking a thin membrane is eliminated and handling of the membranes is simplified.

Other features and advantages will occur from the following description of a preferred embodiment and the accompanying drawings in which:

DETAILED DESCRIPTION OF PREFERRED EMBODIMENT

Figure 1:
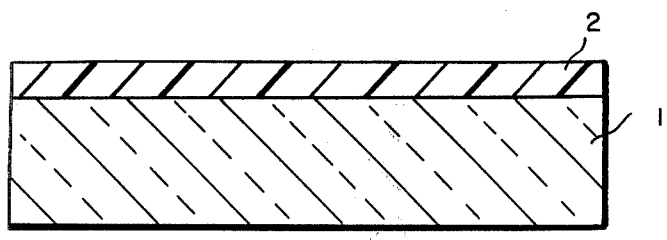
FIG. 1 is a diagrammatic cross section of the polyimide film on a glass substrate.
Figure 2:
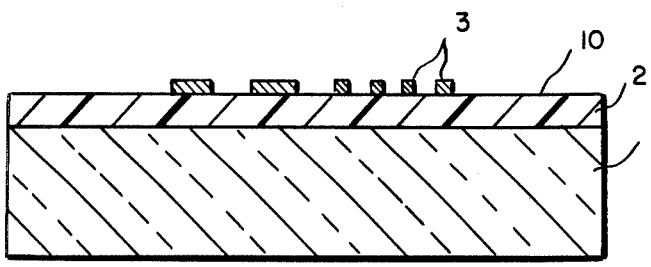
FIG. 2 is a diagrammatic cross section of the polyimide film with an absorber pattern.

A substrate 1 of small, thin glass, typically 0.211 glass, Corning Glass Corp., approximately 200 micrometers thick is thoroughly cleaned of all particulates and contamination by standard techniques strong enough to withstand handling and thin enough to be etched in a reasonable time (any glass thickness can be used). A film of polyamic acid 2, typically E. I. DuPont Corp. Product PI-2530 as described in U.S. Pat. No. 3,179,634 or other polyimide plastic precursors, is spun onto the surface of the substrate 1 by conventional spinning techniques known to those skilled in the art for spinning photoresists. Thicknesses of 0.05–5 micrometers can be obtained by spinning. Any of the well-known coating techniques such as dipping or spraying will also be satisfactory. These thicknesses can be obtained using various dilutions of polyamic acid in a solution of N-Methyl-2-pyrollidone and acetone or any of the solvent combinations suggested by the manufacturer of polyamic acid. One such solution is 4 parts of polyamic acid, 1 part N-Methyl-2-pyrollidone, and 1 part acetone which results in a polyimide thickness of about 1 micrometer when spun at 6000 rpm. Once a film of polyamic acid 2 on the glass 1 has been obtained, the polyamic acid 2 is converted to polyimide 2 by curing the film at 150° C. for 15 minutes and then at 250° C. for 60 minutes. Curing times and temperatures are not critical and other combinations are possible. After the film 2 has been cured, the absorber pattern of the mask 3 is fabricated on the surface 10 of the film 2. The polyimide film 2 is chemically inert and is not significantly affected by most of the chemical or processes used in state-of-the-art mask microfabrication processes and known to those skilled in the art. In addition, the substrate 1 can act as a heat sink for the thin polyimide film or membrane 2. The heat sink substrate 1 allows the use of mask fabrication techniques such as metal evaporation and ion beam etching which generate substantial heat on the surface of the membrane to be used to form the mask of metal, such as gold or platinum.

Figure 3:
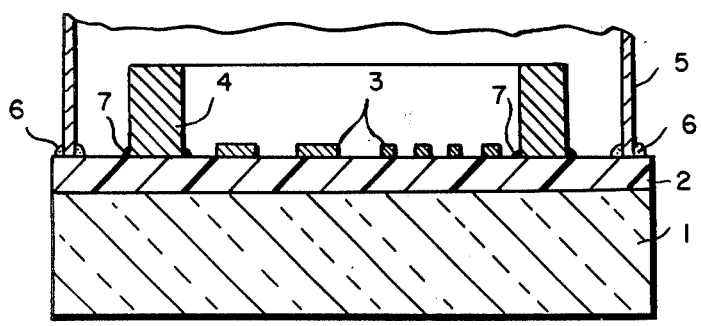
FIG. 3 is a diagrammatic cross section of the polyimide film with an absorber pattern on a glass substrte with a metal tube and a rigid mask holder sealed to the polyimide.
Figure 4:
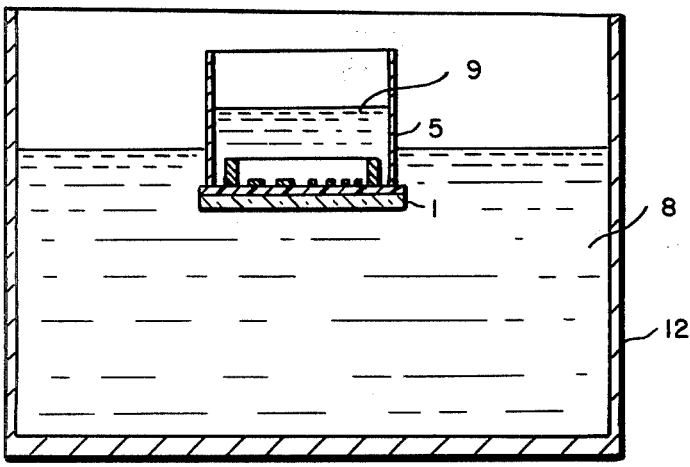
FIG. 4 is a schematic cross-sectional representation of the apparatus used in the process of etching of the glass substrate.

After the absorber pattern mask 3 has been fabricated, a mask holder 4 is glued by adhesive 11 (using for example Tracom 2115 epoxy) to the polyimide 2 as shown in FIG. 3. Also, an etching holder 5 is glued to the polyimide 2 outside of the area encompassed by the mask holder 4. The adhesive 6 used to seal the etching holder 5 to the polyimide, and the etching holder itself must be resistant to the action of the etchant used to subsequently dissolve the substrate 1. Copper tubing is a convenient etching holder and an adhesive 6 resistant to concentrated HF which has been found to be satisfactory is Devcon ® 5 min. epoxy. The etching holder 5 and substrate 1 are held in a solution of Hydrofluoric acid 8 in container 12 shown in FIG. 4. A convenient etching solution for Corning 0211 glass is 2 parts of HF to 1 part $H_2O$ which etches at a rate of approximately 10 micrometers per minute. Other glasses and etchant solutions may be used. During etching a backing liquid 9 such as isopropyl alcohol can be used to provide a positive pressure against the polyimide surface 2 to prevent the entry of any etchant through pinholes in the polyimide film 2 if the metal mask 3 or mask holder 4 is of a material which is attacked by the etchant. Otherwise, the backing liquid 9 is not required.

It is possible to easily ascertain when the glass 1 has been completely dissolved by the etchant 8. This is done by dipping the copper tube-substrate combination into water and observing the etched surface. If the glass has been removed the water will form droplets on the surface which easily run off the polyimide. If glass still remains attached to the polyimide film 2 the water will uniformly coat the glass surface. In this case, further etching is necessary.

Figure 5:
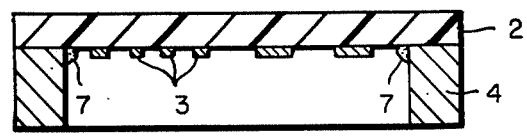
FIG. 5 is a cross section of a completed mask prepared by bonding the rigid mask holder before etching of the substrate.

Once the glass has been removed, the etchant is rinsed from the copper tube 5 and polyimide film 2 by immersion in water and isopropyl alcohol. The backing liquid 9 is removed and the membrane is dried by evaporation or is blown dry using a jet of dry nitrogen. Finally, the superfluous polyimide membrane outside of the mask holder 4 is cut away to yield the completed mask as shown in FIG. 5.

Figure 6:
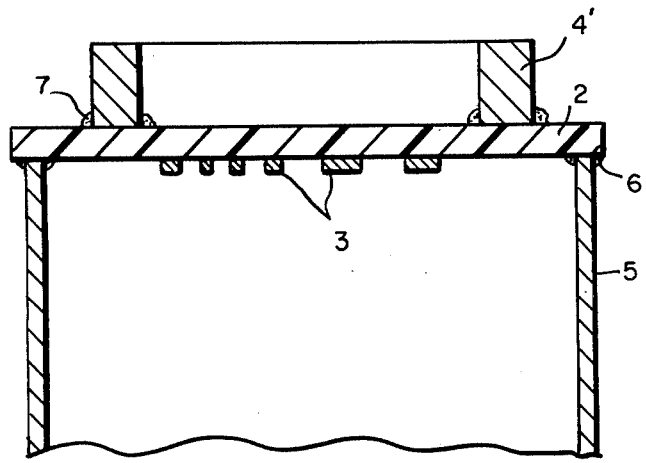
FIG. 6 is a cross-sectional view of the transfer of a polyimide membrane to a rigid holder.
Figure 7:
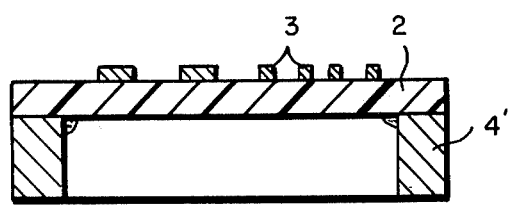
FIG. 7 is a cross-sectional view of a completed mask where the membrane has been mounted after substrate etching.

An alternative is to transfer the completed mask to a smaller mask holder. An adhesive 7 (Tracom 2115, for example) is applied to the surface of a mask holder 4' and the mask holder is placed on the polyimide membrane 2, as shown in FIG. 6. When the adhesive has hardened, the superfluous membrane is cut away to yield a completed mask as shown in FIG. 7.

Although the etching holder 5 must be fabricated from a material which is resistant to the action of the substrate etchant 8, no such restriction applies to the mask holder 4 or 4'. Any rigid material can be used as a mask holder and any shape or thickness of holder is compatible with the process. As an example, the mask holder 4 can be a silicon ring with a flat face. The flatness of the holder 4 is not critical if the holder is mounted before etching of the substrate 1 because the adhesive 7 will conform to the polyimide membrane surface 2, whose flatness has been determined by the flatness of the substrate 1.

Figure 8:
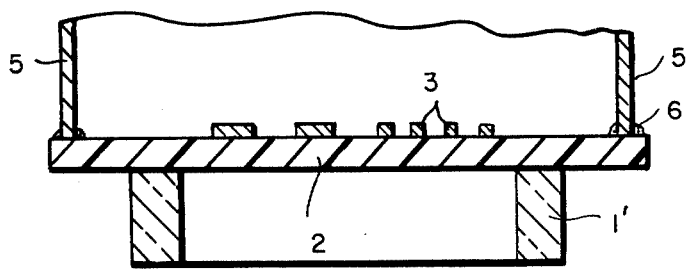
FIG. 8 is a cross-sectional view of a mask fabrication step where the mask is to be supported by a ring of the etched substrate after the etching holder is removed.

It will be apparent to those skilled in the art that the glass substrate 1 can be masked and selectively etched by conventional techniques to leave a ring 1' of glass, as shown in FIG. 8, instead of using a separate mask holder 4.

It will also be apparent that the supported membrane with a metallic coating, patterned or otherwise, as described in this invention, has other uses than as a mask and the invention is not to be so limited.

Although the process has been described in detail using a specific plastic, polyimide in its liquid and hardened form, and a metal deposit thereon, it will be apparent that many other plastics may be used which may be applied in liquid form and subsequently hardened by heat evaporation of a solvent or chemical reaction. The materials deposited on the plastic may be any that are capable of being sputter deposited, vapor deposited or chemically deposited to form a bond to the plastic and need not be limited to a metal such as gold or platinum, which are commonly used for lithographic masks.

It is evident that those skilled in the art, once given the benefit of the foregoing disclosure, may now make numerous other uses and modifications of, and departures from the specific embodiments described herein without departing from the inventive concepts. Consequently, the invention is to be construed as embracing each and every novel feature and novel combination of features present in, or possessed by, the apparatus and techniques herein disclosed and limited solely by the scope and spirit of the appended claims.

What is claimed is:

1. A method of making a soft-x-ray mask of a composite sheet of x-ray transmissive plastic and another x-ray opaque patterned material comprising:
    applying said plastic in liquid form to a substrate,
    hardening said plastic to form an optically smooth polymer film of plastic whose thickness and composition is substantially transparent to soft-x-rays and which has a mechanical bond to said substrate, depositing photolithographically patternable soft x-ray opaque material on said hardened plastic to form a mechanical bond therewith and hence a composite material of said plastic and opaque material, patterning a region of said deposited material to form a mask of said x-ray opaque material on said plastic, adhesively attaching a mechanical support to said composite material to enclose said patterned region within said support, dissolving the entire said substrate to leave only the composite material as attached to said support, removing that portion of said composite material external to said mechanical support to provide a supported mask.

2. The method of claim 1 wherein:

said liquid form of plastic is polyimide plastic precursor, said hardening comprises heating said precursor to form a polyimide film, said substrate is a glass, said depositing of material on said polyimide film comprises vaporizing a metal and depositing the vapor on the film, said dissolving of the substrate comprises etching away said glass in hydrofluoric acid.

3. The method of claim 2 wherein:

said applying of the polyimide plastic precursor on the glass substrate comprises spinning said precursor and substrate to form a layer of liquid precursor of substantially uniform thickness.

4. The method of claim 2 comprising in addition:

forming a pattern in said deposited metal by ion beam etching away selected portions of the metal.

5. The method of claim 2 wherein:

said mechanical support forms a liquid barrier to prevent said hydrofluoric acid from entering the region within said support, filling said support with a liquid prior to the etching step to prevent said acid from passing through said composite material during the etching.

6. The method of claim 2 wherein said polyimide film has a thickness between $0.05\mu$ and $3\mu$.

7. The method of claim 1 comprising in addition:

adhesively attaching a mask holder to said composite material to contain said pattern within said mask holder, said attachment being made before said substrate is etched away, and removing said attached mechanical support after said substrate is totally etched away to leave said composite material within and attached only to and supported by said mask holder.

8. The method of claim 1 comprising in addition:

adhesively attaching a mask holder to the plastic nonpatterned side of said composite material to contain said pattern within said mask holder, said attachment being made after said substrate is etched away, and thereafter removing said attached mechanical support after said substrate is totally etched away to leave said composite material within and attached only to and supported by mask holder.

9. The method of claim 1 wherein:

said mechanical support comprises a first and second mechanical support each adhesively attached to said composite material, said second mechanical support forming a liquid tight enclosure around said first mechanical support, said first mechanical support being of a material which would be dissolved at the time that said substrate is being dissolved in the absence of being enclosed by said second mechanical support, and wherein said removing of the composite material comprises removing said second mechanical support and said composite material external to said first mechanical support.

10. The method of claim 1 wherein said patterning of said x-ray opaque material includes removing said opaque material from the region of attachment of said mechanical support to result in said attachment of said mechanical support being to said plastic.

11. The method of making a soft x-ray mask of composite sheet of x-ray transmissive plastic and an x-ray opaque material comprising:

applying said plastic in liquid form to a substrate, hardening said plastic to form an optically smooth polymer film of plastic of thickness and composition substantially transparent to soft-x-rays, said plastic having a mechanical bond to said substrate, depositing a photolithographically patternable soft-x-ray opaque material on said hardened plastic to form a mechanical bond therewith and hence a composite material of said plastic and opaque material, patterning a region of said deposited material to form a mask of said x-ray opaque material on said plastic, adhesively attaching a mechanical support to said composite material to enclose said patterned region within said support, selectively dissolving said substrate to leave only a portion of said substrate in the form of a ring attached to said plastic to support said composite material, said supporting substrate enclosing said patterned region within the region supported by said mechanical support, removing said composite material and mechanical support external to said substrate support ring to leave said substrate support ring attached to said film to provide a supported mask.

12. The method of claim 11 wherein:

said liquid form of plastic is polyimide plastic precursor, said hardening comprises heating said precursor to form a polyimide film, said substrate is a glass, said depositing of material on said polyimide film comprises vaporizing a metal and depositing the vapor on the film, said dissolving of the substrate comprises etching away said glass in hydrofluoric acid.

13. The method of claim 12 wherein said polyimide film has a thickness between $0.05\mu$ and $3\mu$.

14. The method of claim 11 wherein:

said applying of the polyimide plastic precursor on the glass substrate comprises spinning said precursor and substrate to form a layer of liquid precursor of substantially uniform thickness.

15. The method of claim 11 comprising in addition:

forming a pattern in said deposited metal by ion beam etching away selected portions of the metal.

16. The method of claim 11 wherein:

said mechanical support forms a liquid barrier to prevent said hydrofluoric acid from entering the region within said support, filling said support with a liquid prior to the etching step to prevent said acid from passing through said composite material during the etching.

17. The method of claim 11 wherein said patterning of said x-ray opaque material includes removing said opaque material from the region of attachment of said mechanical support to result in said attachment of said mechanical support being to said plastic.

* * * * *